(12) United States Patent
Hiraide

(10) Patent No.: US 11,360,435 B2
(45) Date of Patent: Jun. 14, 2022

(54) ELECTRONIC APPARATUS

(71) Applicant: SEIKO EPSON CORPORATION, Tokyo (JP)

(72) Inventor: Noriaki Hiraide, Anan (JP)

(73) Assignee: SEIKO EPSON CORPORATION, Tokyo (JP)

(*) Notice: Subject to any disclaimer, the term of this patent is extended or adjusted under 35 U.S.C. 154(b) by 826 days.

(21) Appl. No.: 16/245,388

(22) Filed: Jan. 11, 2019

(65) Prior Publication Data

US 2019/0219970 A1 Jul. 18, 2019

(30) Foreign Application Priority Data

Jan. 12, 2018 (JP) .............................. JP2018-003158

(51) Int. Cl.
*G04B 37/08* (2006.01)
*G04C 10/02* (2006.01)
*G04B 37/18* (2006.01)
*H01L 31/055* (2014.01)

(52) U.S. Cl.
CPC .......... *G04B 37/084* (2013.01); *G04B 37/18* (2013.01); *G04C 10/02* (2013.01); *H01L 31/055* (2013.01)

(58) Field of Classification Search
CPC ...... G04B 37/084; G04B 37/18; G04C 10/02; H01L 31/055; G04G 21/025

USPC ......................................................... 368/276
See application file for complete search history.

(56) References Cited

U.S. PATENT DOCUMENTS

| 8,964,511 B2 * | 2/2015 | Fujisawa ................ G04R 60/12 368/47 |
| 2002/0071346 A1 * | 6/2002 | Paratte ................... G04G 21/04 368/10 |
| 2002/0080688 A1 | 6/2002 | Hiranuma et al. |
| 2004/0145975 A1 * | 7/2004 | Barras .................... G04G 21/04 368/281 |

FOREIGN PATENT DOCUMENTS

| JP | S51-084460 U | 7/1976 |
| JP | S52-005564 U | 1/1977 |
| JP | S52-161661 U | 12/1977 |
| JP | 2002-189084 A | 7/2002 |

* cited by examiner

*Primary Examiner* — Edwin A. Leon
(74) *Attorney, Agent, or Firm* — Oliff PLC

(57) ABSTRACT

An electronic apparatus includes a case (case body) including a bottom wall and a sidewall integrated with each other, having an opening, and having a receiving surface provided as part of the sidewall and along the circumferential edge of the opening, a light transmissive member that covers the opening and is placed on the receiving surface, and a bezel provided in a position outside the sidewall that forms the receiving surface and so attached to the case as to be pressed toward the sidewall.

7 Claims, 16 Drawing Sheets

ELECTRONIC APPARATUS

BACKGROUND

1. Technical Field

The present invention relates to an electronic apparatus including a case having a one-piece structure.

2. Related Art

There has been a known electronic apparatus that employs a case having what is called a one-piece structure that is a case having the bottom wall and the sidewall (barrel) integrated with each other, as described, for example, in JP-A-2002-189084. The electronic apparatus described in JP-A-2002-189084 employs a configuration in which screws are inserted into clearance screw holes provided in the barrel to fix a glass frame that fixes a glass plate to the barrel. The configuration allows the glass plate to be detached from the barrel by detaching the screws and therefore allows disassembly of the electronic apparatus.

In the electronic apparatus described in JP-A-2002-189084, however, the glass frame and the barrel are fixed to each other with the screws by use of the screw clearance holes provided in the barrel, and the thickness of the barrel therefore increases by the amount corresponding to the screw clearance holes. It is therefore difficult to achieve reduction in size of the electronic apparatus.

SUMMARY

An advantage of some aspects of the invention is to provide a compact electronic apparatus that employs a case having a one-piece structure that can be disassembled.

Application Example 1

An electronic apparatus according to this application example includes a case including a bottom wall and a sidewall integrated with each other, a light transmissive member placed in a position inside the sidewall, a bezel placed in a position outside the sidewall. The sidewall has a first sidewall section that is an upper portion of the sidewall and receives the transmissive member in a planar direction, and the bezel is so placed as to press inward the outer surface of the first sidewall section on which the light transmissive member is placed.

According to this application example, a case having a one-piece structure that is compact because no screw is used can be achieved. To disassemble the electronic apparatus, detaching the bezel removes the pressure exerted by the bezel on the first sidewall section, and the first sidewall section is pressed outward by the light transmissive member, so that the first sidewall section is bent outward. In other words, detachment of the bezel removes the pressure exerted by the bezel on the first sidewall section, and the first sidewall section bent inward by the inward pressure exerted by the bezel attempts to return to the original position before the assembly. As a result, the pressing force exerted by the first sidewall section on the light transmissive member decreases, whereby the light transmissive member can be detached with force having very small magnitude. An electronic apparatus including a case having a one-piece structure that is compact and can be disassembled can therefore be achieved.

Application Example 2

It is preferable that the electronic apparatus according to the application example described above includes a second sidewall section that is a portion disposed between the first sidewall section and the bottom wall and receives the light transmissive member in a cross-sectional direction, and that an end surface of the bezel that is a surface facing the bottom wall is disposed between the receiving surface, which is part of the second sidewall section and receives the light transmissive member, and the bottom wall.

According to this application example, since the end surface of the bezel that is the surface facing the bottom wall is disposed between the receiving surface, which is part of the second sidewall section and receives the light transmissive member, and the bottom wall, the length of the first sidewall section in the cross-sectional direction can be increased, whereby the flexibility of setting of the pressing force exerted by the first sidewall section in the planar direction can be improved, in addition to the advantageous effect provided by Application example 1. As a result, to disassemble the electronic apparatus by detaching the bezel, the first sidewall section is more readily bent outward, or the first sidewall section readily returns to the original position before the assembly, whereby the light transmissive member can be more readily detached. Further, the first sidewall section and the second sidewall section, which is thicker than the first sidewall section, are pressed by the bezel toward the interior of a case body, whereby the rigidity of the entire case body can be increased.

Application Example 3

In the electronic apparatus according to the application example described above, it is preferable that an elastic member is placed between an inner surface of the first sidewall section and an outer circumferential end surface of the light transmissive member.

According to this application example, the elastic member absorbs the pressure exerted by the first sidewall section and the light transmissive member in the assembled electronic apparatus. To disassemble the electronic apparatus by detaching the bezel, the pressing force absorbed by the elastic member serves as pressing force that presses the first sidewall section outward. The first sidewall section is therefore more readily bent outward, or the first sidewall section readily returns to the original position before the assembly, whereby the light transmissive member can be more readily detached.

Application Example 4

In the electronic apparatus according to the application example described above, it is preferable that an interposed member is placed between the receiving surface, which is part of the second sidewall section and receives the light transmissive member, and the light transmissive member.

According to this application example, placing the interposed member increases the length of the first sidewall section by the amount corresponding to the placed interposed member, whereby the flexibility of the setting of the pressing force exerted by the first sidewall section in the planar direction can be improved. Therefore, in the disassembly of the electronic apparatus, detachment of the bezel allows the first sidewall section to be readily bent outward or the first sidewall section to readily return to the original position before the assembly, whereby the light transmissive member can be more readily detached.

Application Example 5

In the electronic apparatus according to the application example described above, it is preferable that the sidewall has a third sidewall section disposed between the second sidewall section and the bottom wall, and that the electronic apparatus further includes an exterior cover disposed in a position not only closer to the bottom wall than an end surface of the bezel that is a surface facing the bottom wall but outside the third sidewall section.

According to this application example, providing the exterior cover improves decorativeness of the electronic apparatus.

Application Example 6

In the electronic apparatus according to the application example described above, it is preferable that a groove is provided on an outer side of the sidewall and between the second sidewall section and the third sidewall section.

According to this application example, providing the groove can further improve the flexibility of the setting of the pressing force exerted by the first sidewall section in the planar direction. Therefore, in the disassembly of the electronic apparatus, the light transmissive member can be more readily detached.

Application Example 7

In the electronic apparatus according to the application example described above, it is preferable that the second sidewall section and the third sidewall section are made of different resin materials.

According to this application example, when the second sidewall section and the third sidewall section made of different resin materials are provided, detachment of the bezel causes the first sidewall section to be readily bent outward or return to the original position before the assembly. The pressing force exerted by the first sidewall section on the light transmissive member therefore decreases, whereby the light transmissive member can be more readily detached.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described below with reference to the drawings. It is not intended that the embodiments described below unduly limit the contents of the invention set forth in the appended claims, and all configurations described in the embodiments are not necessarily essential configuration requirements of the invention. In the following drawings, each member is so enlarged or reduced as appropriate as to make the member recognizable.

First Embodiment

Figure 1:
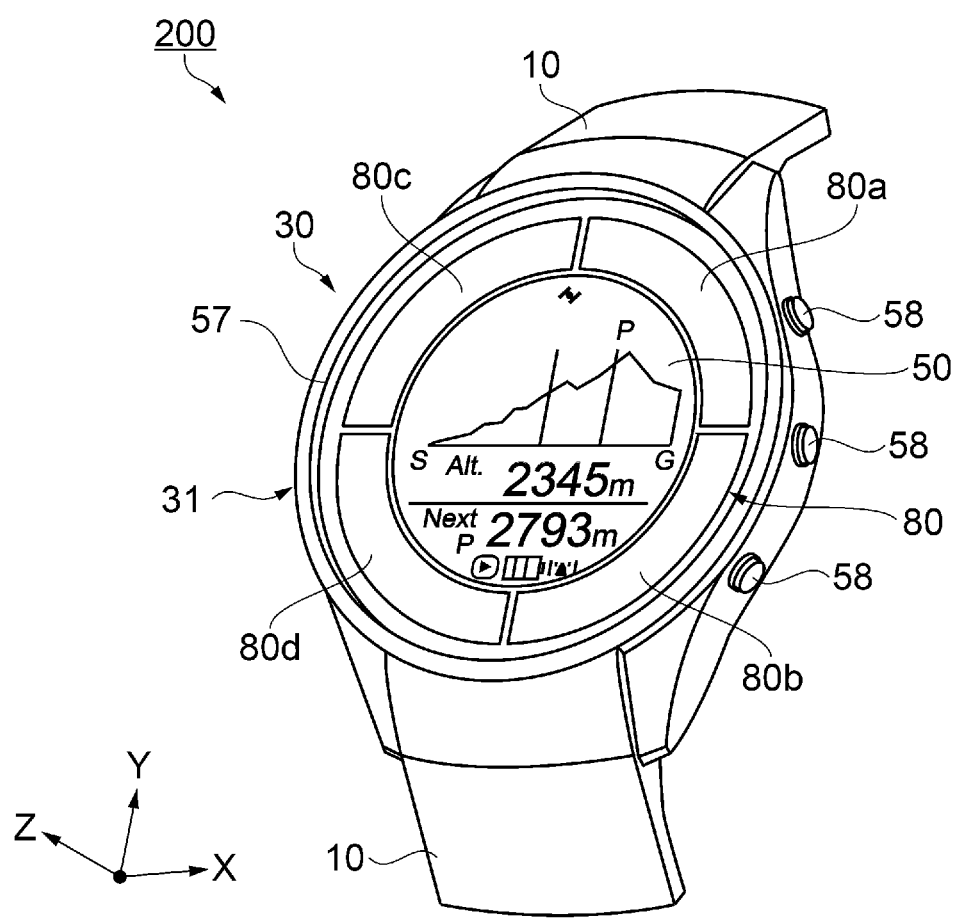
FIG. 1 is an exterior appearance perspective view showing a schematic configuration of a wrist apparatus according to a first embodiment viewed from the side facing the front side of the wrist apparatus.
Figure 2:
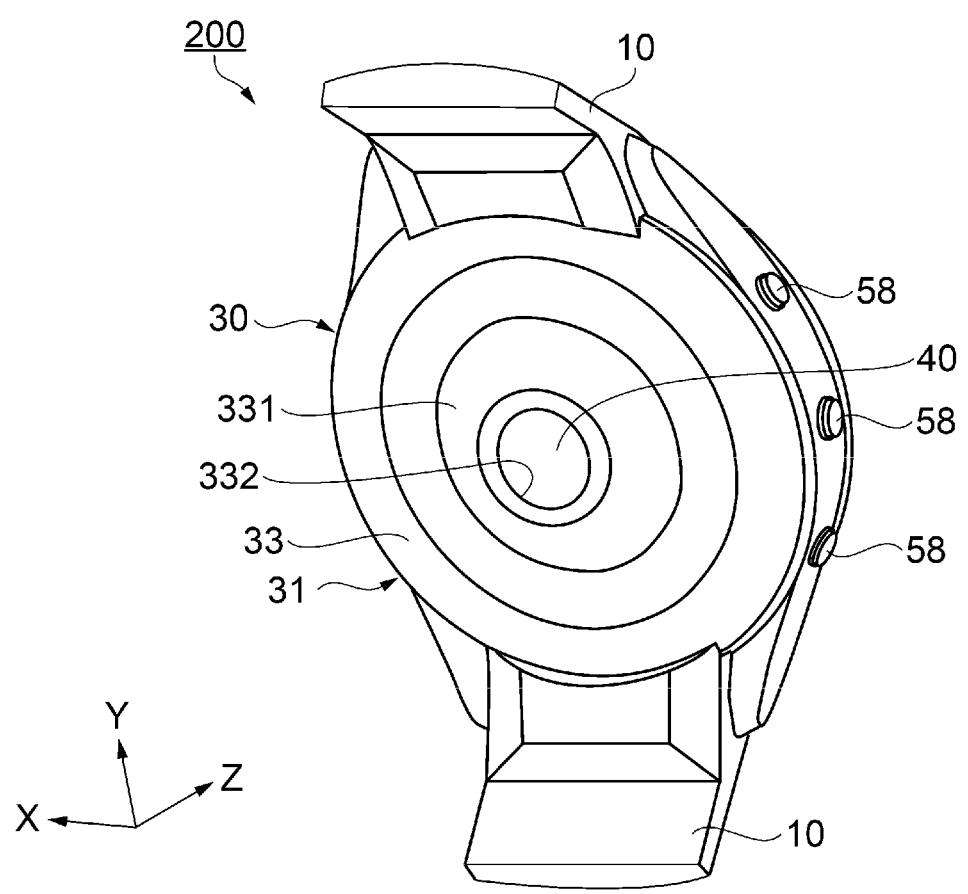
FIG. 2 is an exterior appearance perspective view showing the schematic configuration of the wrist apparatus viewed from the side facing the rear side of the wrist apparatus.
Figure 3:
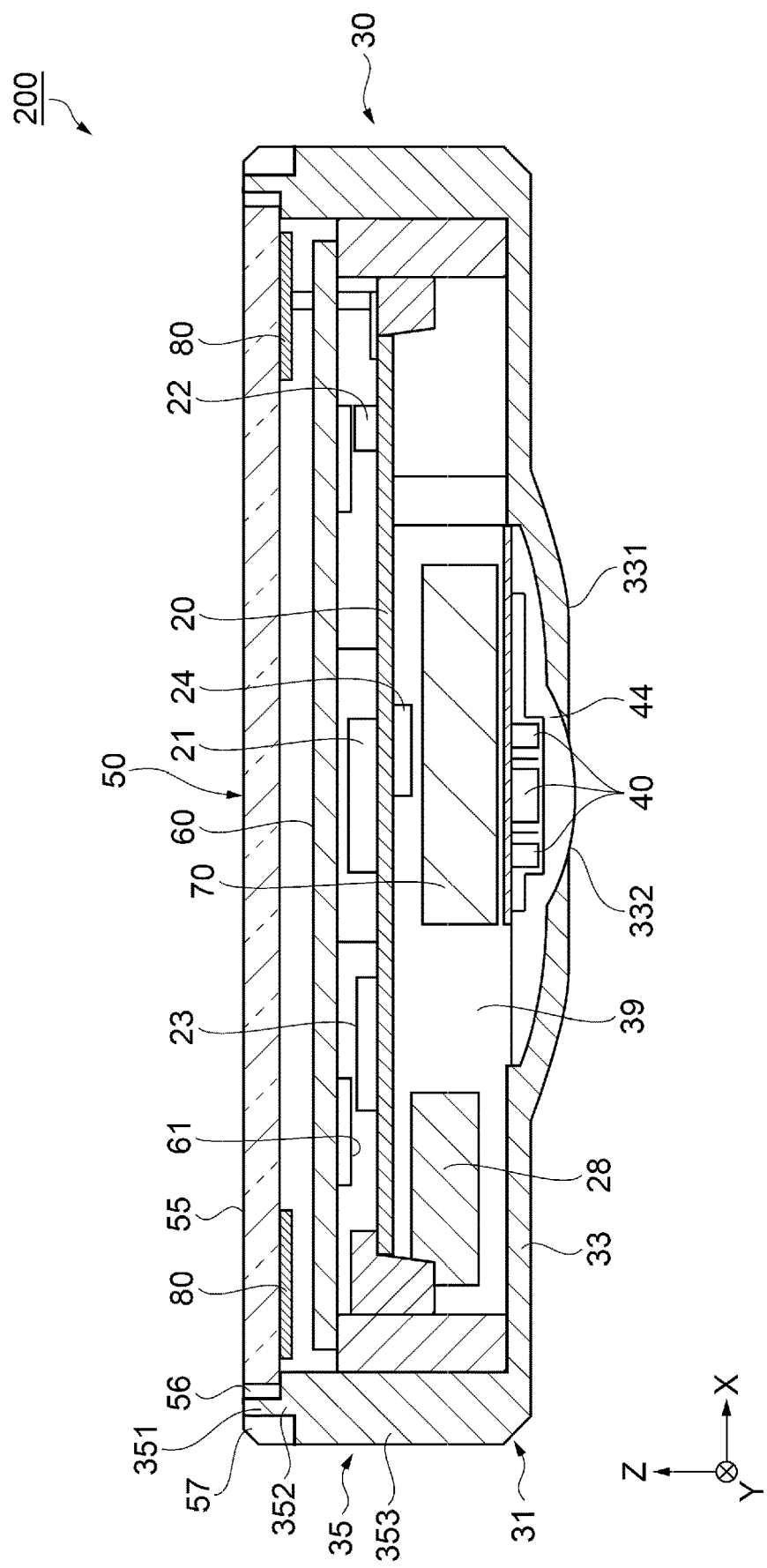
FIG. 3 is a cross-sectional view showing the configuration of the wrist apparatus.
Figure 4:
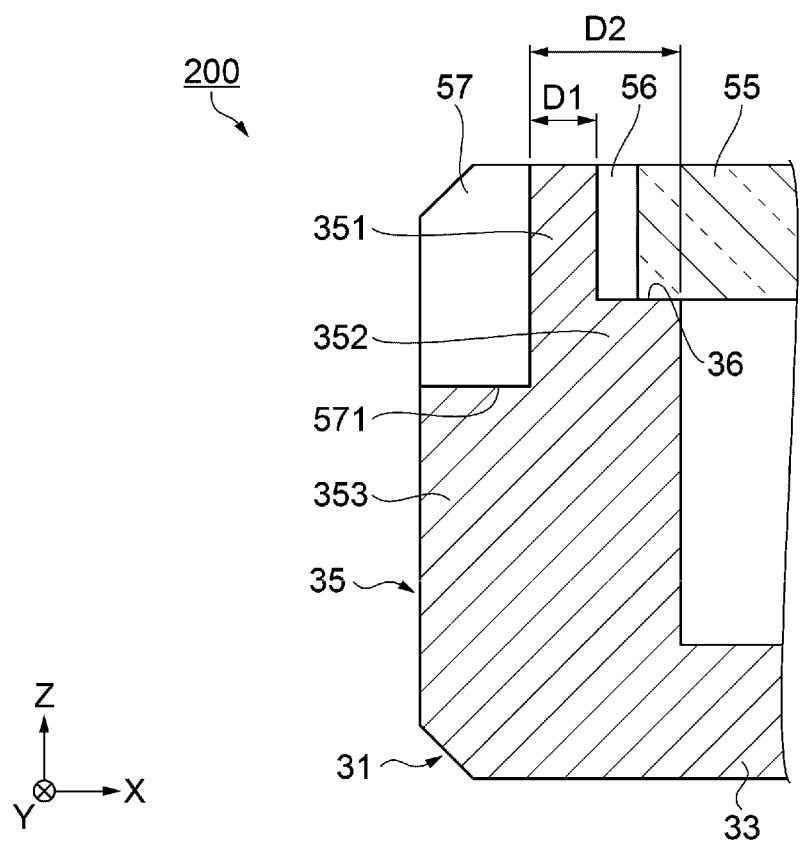
FIG. 4 is a partial enlarged view of a case body, a light transmissive member, and a bezel.

As an electronic apparatus according to the present embodiment, for example, a wrist apparatus (wearable apparatus) worn around a user's wrist and including a pulse wave sensor and a body motion sensor is presented by way of example and described with reference to FIGS. 1, 2, 3, and 4. FIG. 1 is an exterior appearance perspective view showing a schematic configuration of a wrist apparatus 200 according to the present embodiment viewed from the side facing the front side (display surface side) of the wrist apparatus 200. FIG. 2 is an exterior appearance perspective view showing the schematic configuration of the wrist apparatus 200 viewed from the side facing the rear side of the wrist apparatus 200. FIG. 3 is a cross-sectional view showing the configuration of the wrist apparatus 200. FIG. 4 is a partial enlarged view of a case body 31, a light transmissive member 55, and a bezel 57.

The following description of the wrist apparatus 200 will be made on the assumption that in a situation in which the user wears an apparatus body 30, the side facing a target object that is a target body part under measurement, for example, of biological information (surface in contact with target object) is called "rear side or rear surface side," and the side facing a display surface of the apparatus body 30, which is the side opposite the target object side, (surface where user visually recognizes information) is called "front side or front surface side." Further, a coordinate system is set with reference to the case body (case) 31 of the wrist apparatus 200, and the display surface of the display section 50 is called the front surface. Under the definition described above, the direction that intersects the display surface of a display section 50 (display panel 60, such as liquid crystal display, or dial of analog timepiece) and extends from the rear surface toward the front surface of the display section 50 is called a Z-axis positive direction (+Z-axis direction). The Z-axis positive direction may instead be defined to be the direction extending from an optical sensor section 40 (including light emitting diode and photodiode) toward the display section 50 or the direction away from the case body 31 in the direction of a normal to light receiving surfaces 80a, 80b, 80c, and 80d of panels that form a solar battery 80. Two axes perpendicular to the axis Z are called axes X and Y, and the axis Y, in particular, is so set as to coincide with the direction in which band sections 10 are attached to the case body 31. The light receiving surfaces 80a, 80b, 80c, and 80d are each a surface via which light is incident on the solar battery 80.

FIG. 1 is a perspective view of the wrist apparatus 200, with the band sections 10 fixed thereto, viewed in the +Z-axis direction or from the front side (the side facing the display section 50) in the state in which the wrist apparatus 200 is worn. FIG. 2 is a perspective view of the wrist apparatus 200 viewed in the −Z-axis direction or from the rear side opposite the viewing side in FIG. 1. FIG. 3 is a cross-sectional view of the wrist apparatus 200 viewed in the −Y-axis direction. FIG. 4 is a partial enlarged view of the wrist apparatus 200 viewed in the −Y-axis direction.

The wrist apparatus 200 as the electronic apparatus is worn on the user's predetermined body part (body part under measurement, for example, wrist), as shown in FIGS. 1, 2, and 3 and detects pulse wave information, position information, and other pieces of information. The wrist apparatus 200 includes the apparatus body 30, which includes the case body 31, is in intimate contact with the user, and detects the pulse wave information and other pieces of information, and the pair of band sections 10, which are attached to the apparatus body 30 and allow the user to wear the apparatus body 30.

The apparatus body 30 including the case body 31 is provided with the display section 50, the solar battery 80, which has the light receiving surfaces 80a, 80b, 80c, and 80d disposed in an outer edge portion of the light transmissive member 55 in a plan view in the +Z-axis direction (direction of normal to light receiving surfaces 80a, 80b, 80c, and 80d), and a measurement window 332, which corresponds to the optical sensor section 40 (see FIG. 3) as a biological information measuring section. The display section 50 may be so disposed as to overlap with part of the solar battery 80 in the plan view in the +Z-axis direction (direction of normal to light receiving surfaces 80a, 80b, 80c, and 80d). A plurality of operation sections (operation buttons) 58 are provided on the outer side surface of the apparatus body 30, and the bezel 57 is so provided and disposed as to annularly surround the outer edge of the light transmissive member 55. It is, however, noted that the wrist apparatus 200 does not necessarily have the configuration described above and can be changed in a variety of manners. For example, part of the components described above can be omitted, and another component can be added to the wrist apparatus 200.

The apparatus body 30 includes the case body 31, which opens toward the front side. The case body 31 has a bottom wall 33, which forms the rear side of the case body 31, and a sidewall 35, which forms a barrel section of the case body 31, with the bottom wall 33 and the sidewall 35 integrated with each other. The bottom wall 33 includes a convex section 331, which protrudes from the rear surface or the rear-side surface of the case body 31, and the measurement window 332, which is provided at a top portion of the convex section 331 and covers the optical sensor section 40. In the plan view in the +Z-axis direction, the optical sensor section 40 as the biological information measuring section is disposed in a position corresponding to the measurement window 332, and a transparent cover 44 is inserted into the measurement window 332. The transparent cover 44 may protrude beyond the top portion of the convex section 331.

The sidewall 35 has a first sidewall section 351, a second sidewall section 352, and a third sidewall section 353. The sidewall 35 further has a receiving surface 36, which is a surface located in the case body 31 and perpendicular to the +Z-axis direction. The first sidewall section 351 refers to an upper portion of the sidewall 35 and is disposed between the receiving surface 36 and the opening of the case body 31. The second sidewall section 352 refers to a portion that is part of the sidewall 35 and has the receiving surface 36. The third sidewall section 353 refers to a portion that is part of the sidewall 35 and excludes the first sidewall section 351 and the second sidewall section 352. The receiving surface 36 has a shape that follows the shape of the case body 31, for example, an annular shape in a case where the sidewall 35 has an annular shape. The receiving surface 36 may instead have an annular shape with an arbitrary portion thereof cut out.

The bezel 57 is provided on the side facing the outer circumferences of the first sidewall section 351 and the second sidewall section 352 (outside the case body 31). In other words, surfaces of the first sidewall section 351 and the second sidewall section 352 that are the surfaces in contact with the bezel 57 are outer circumferences (outer surfaces) of the first sidewall section 351 and the second sidewall section 352. The light transmissive member (glass plate in the present embodiment) 55, which is a transparent plate, is provided on the receiving surface 36. That is, the first sidewall section 351 receives the light transmissive member 55 in a planar direction, and the second sidewall section 352 (receiving surface 36) receives the light transmissive member 55 in a cross-sectional direction. In other words, the first sidewall section 351 is in contact with the light transmissive member 55 in the planar direction, and the second sidewall section 352 is in contact with the light transmissive member 55 in the cross-sectional direction. The planar direction used herein refers to the direction parallel to the plane X-Y (direction perpendicular to axis Z). The cross-sectional direction refers to the direction parallel to the Z-axis direction.

The light transmissive member 55 is so disposed as to close the opening of the case body 31 in the plan view in the direction that intersects the light receiving surfaces 80a, 80b, 80c, and 80d of the solar battery 80 at right angles, in other words, in the +Z-axis direction. An elastic member 56 is disposed between the outer circumferential end surface of the light transmissive member 55 (surface that intersects plane X-Y) and the inner surface (inner circumference) of the first sidewall section 351. In other words, the light transmissive member 55 is attached to the inner surface of the first sidewall section 351 via the elastic member 56. The elastic member 56 is, for example, a member comparable to a packing or a gasket. The outer circumference of the first sidewall section 351 and the inner surface (inner circumference) of the first sidewall section 351 are concentric circles having different diameters when viewed in the Z-axis direction. An internal space 39, which is a closed space, is provided in the interior, which is surrounded by the case body 31 and the light transmissive member 55, which closes the opening of the case body 31, of the case body 31.

The light transmissive member 55 is not limited to a glass plate and can instead be made of a transparent plastic material, sapphire glass, or any material other than glass as long as the light transmissive member 55 is a light translucent member that allows observation of the display section 50 and is strong enough to be able to protect element parts accommodated in the internal space 39, such as the liquid crystal display (display panel 60) that forms the display section 50.

The first sidewall section 351 is pressed by the bezel 57 toward the interior of the case body 31. In other words, the bezel 57 applies force acting in the thickness direction of the first sidewall section 351 to the first sidewall section 351. The first sidewall section 351, when pressed by the bezel 57 toward the interior of the case body 31, presses the light transmissive member 55 via the elastic member 56. That is, in the state in which the bezel 57 is attached to the apparatus body 30, the light transmissive member 55 is pressed by the bezel 57 (first sidewall section 351) and held in the case body 31. The elastic member 56 can absorb variation in the magnitude of the pressing force exerted by the first sidewall section 351 on the light transmissive member 55 to achieve pressing force having predetermined magnitude. The first sidewall section 351 thus holds and fixes the light transmissive member 55 to the case body 31 with stable pressing force.

The internal space 39 in the case body 31 accommodates the following element parts that form the wrist apparatus 200: a circuit substrate 20; an orientation sensor 22 and an acceleration sensor 23; a GPS antenna 28; the optical sensor section 40; the liquid crystal display (hereinafter referred to as display panel 60) that forms the display section 50; an illuminator 61, which illuminates the display panel 60; a secondary battery 70 (lithium secondary battery); the solar battery 80; and other components, as shown in FIG. 3. The apparatus body 30, however, does not necessarily have the configuration shown in FIG. 3. For example, an atmospheric pressure sensor for calculating the altitude and other parameters, an air temperature sensor for measuring the temperature, and other sensors, a vibrator, and other components may be added to the configuration shown in FIG. 3. The following components are connected to the circuit substrate 20: wiring lines connected to the element parts described above; a CPU (central processing unit) 21, which serves as a control circuit including a control circuit that controls the sensors, the display section 50 and the like, a drive circuit and the like and other components that form the wrist apparatus 200; and another circuit element 24. FIG. 3 shows a case where the display panel 60 is a transmissive display device (transmissive liquid crystal display device, for example) by way of example. FIG. 3 therefore shows a configuration in which a backlight is employed as the illuminator 61. In FIG. 3, the illuminator 61 is configured to cover part of the display panel 60 and diffuses illumination light over the entire display panel 60. The illuminator 61 may instead be configured to cover the entire display panel 60. The illuminator 61 may, for example, be an LED device. The display panel 60 may instead be a reflective display device (reflective liquid crystal display device or electrophoretic display device, for example). In this case, a front light can be employed as the illuminator 61. Still instead, the display panel 60 may be a self-luminous display device (organic EL display device or LED display device, for example). In this case, the illuminator 61 can be omitted.

Out of the element parts that are arranged in the internal space 39 and form the wrist apparatus 200, the circuit substrate 20, the optical sensor section 40, the display panel 60, and the solar battery 80 are disposed in the following order from the side facing the light transmissive member 55: the solar battery 80; the display panel 60; the circuit substrate 20; and the optical sensor section 40.

The configuration in which the display panel 60, which forms the display section 50, is disposed between the solar battery 80 and the optical sensor section 40 in the case body 31 allows the display panel 60 to block what is called stray light that is produced when part of light intended for power generation and traveling toward the solar battery 80 and forms leakage light that enters the case body 31 from the side facing the solar battery 80, for example, through gaps, whereby the influence of the outside light (stray light) on the optical sensor section 40 can be reduced.

The case body 31 according to the present embodiment will be described with reference to FIG. 4. The thickness D1 of the first sidewall section 351 in the planer direction is smaller than the thickness D2 of the second sidewall section 352 in the planer direction. When the thickness D1 is set to be smaller than the thickness D2, the pressing force exerted by the first sidewall section 351 in the planar direction (inward pressing force) is readily set. In this case, detaching the bezel 57 removes the pressure exerted by the bezel 57 on the first sidewall section 351. To disassemble the wrist apparatus 200, detaching the bezel 57 removes the pressure exerted by the bezel 57 on the first sidewall section 351, and the first sidewall section 351 is pressed outward by the light transmissive member 55, so that the first sidewall section is bent outward. In other words, detachment of the bezel 57 removes the pressure exerted by the bezel 57 on the first sidewall section 351, and the first sidewall section 351 bent inward by the inward pressure exerted by the bezel 57 attempts to return to the original position before the assembly. As a result, the pressing force exerted by the first sidewall section 351 on the light transmissive member 55 decreases, whereby the light transmissive member 55 can be detached with force having very small magnitude, for example, about 40 to 100 N (4 to 10 kgf). An electronic apparatus including a case having a one-piece structure that is compact and can be disassembled can therefore be achieved.

Further, the elastic member 56 absorbs the pressing force exerted by the first sidewall section 351 and the light transmissive member 55 in the assembled wrist apparatus 200. To disassemble the wrist apparatus 200 by detaching the bezel 57, the pressing force absorbed by the elastic member 56 serves as pressing force that presses the first sidewall section 351 outward. The first sidewall section 351 is therefore more readily bent outward, or the first sidewall section 351 readily returns to the original position before the assembly, whereby the light transmissive member 55 can be more readily detached.

Further, when the bezel 57 is attached to the apparatus body 30, an end surface 517 of the bezel 57, which is the surface located on the side facing the bottom wall 33 of the case body 31, is preferably disposed between the receiving surface 36 and the bottom wall 33. The length of the first sidewall section 351 in the cross-sectional direction can therefore be increased, whereby the flexibility of the setting of the pressing force exerted by the first sidewall section 351 in the planar direction can be improved. Therefore, to disassemble the apparatus body 30, detachment of the bezel 57 allows the first sidewall section 351 to be readily bent outward or the first sidewall section 351 to readily return to the original position before the assembly, whereby the light transmissive member 55 can be readily detached. Further, in the case where the end surface 571 of the bezel 57 is disposed between the receiving surface 36 and the bottom wall 33, the first sidewall section 351 and the second sidewall section 352, which is thicker than the first sidewall section 351, are pressed by the bezel 57 toward the interior of the case body 31, whereby the rigidity of the entire case body 31 can be increased.

The case body 31 may be made of a resin material or a metal material. In the case where the case body 31 is made of a resin material, the weight of the entire apparatus body 30 can be reduced. In the case where the case body 31 is made of a metal material, the apparatus body 30 is allowed to have a massive exterior appearance despite of the compact case.

The bezel 57 may be made of a resin material or a metal material. In the case where the bezel 57 is made of a resin material, the weight of the entire apparatus body 30 can be reduced. In the case where the bezel 57 is made of a metal material, the apparatus body 30 is allowed to have a massive exterior appearance despite of the compact case.

In the case where the case body 31 is made of a metal material, the GPS antenna 28 is preferably located in a position where the GPS antenna 28 does not overlap with the solar battery 80 when the apparatus body 30 is viewed from the side facing the front side thereof (+Z-axis-direction side). In the arrangement described above, the GPS antenna 28 is unlikely to be affected by the case body 31, which is made of a metal material, and the solar battery 80 and can therefore precisely receive radio waves.

Employing the configuration described above allows an electronic apparatus including a case having a one-piece structure that can be disassembled to be achieved with use of no screw or any other fixing member. That is, a compact electronic apparatus can be achieved.

The electronic apparatus including a case having a one-piece structure has been described, and the case body 31 may instead be, if necessary, a case having what is called a two-piece structure having a case back.

Second Embodiment

Figure 5:
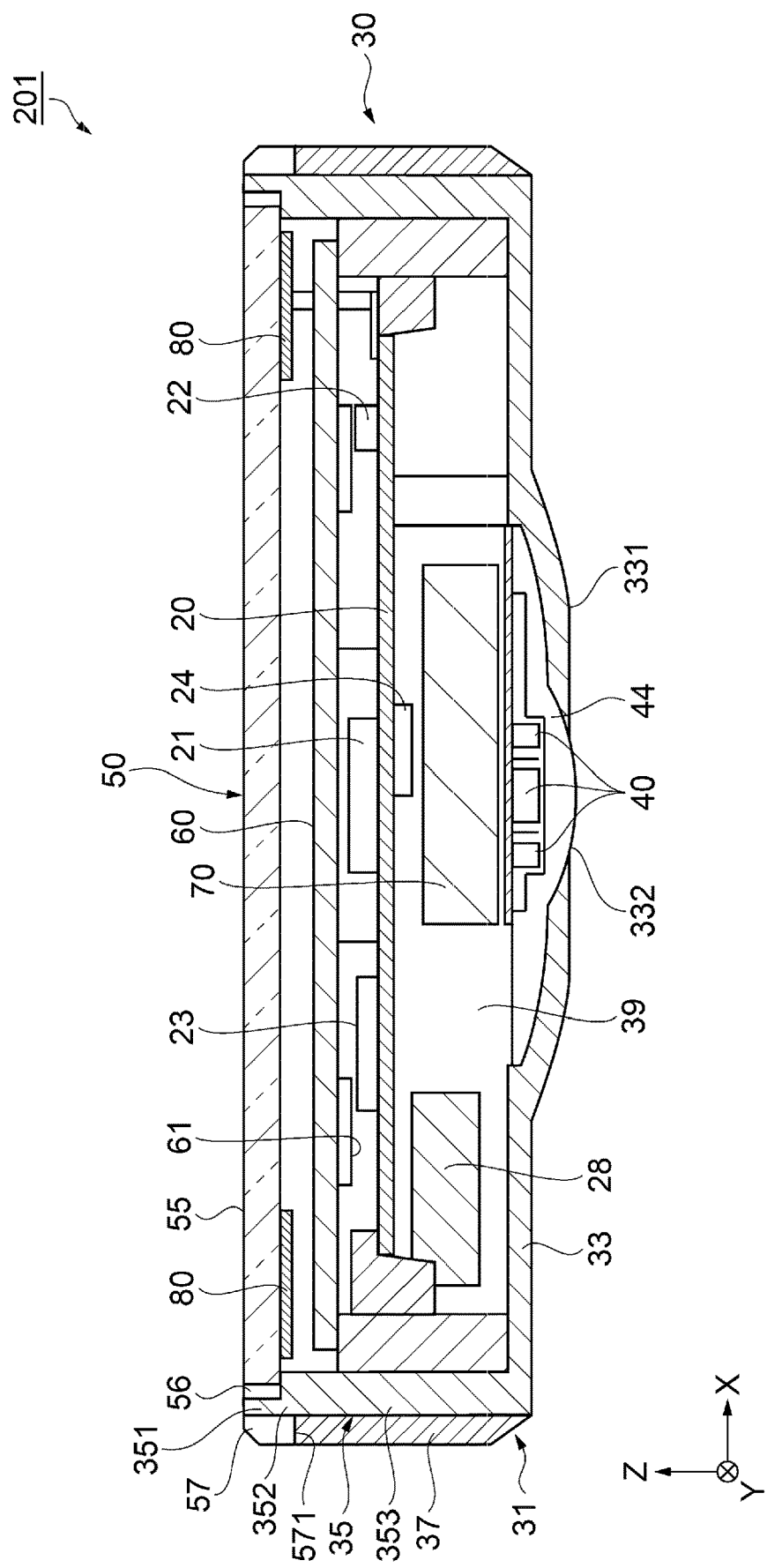
FIG. 5 is a cross-sectional view showing the configuration of a wrist apparatus according to a second embodiment.
Figure 6:
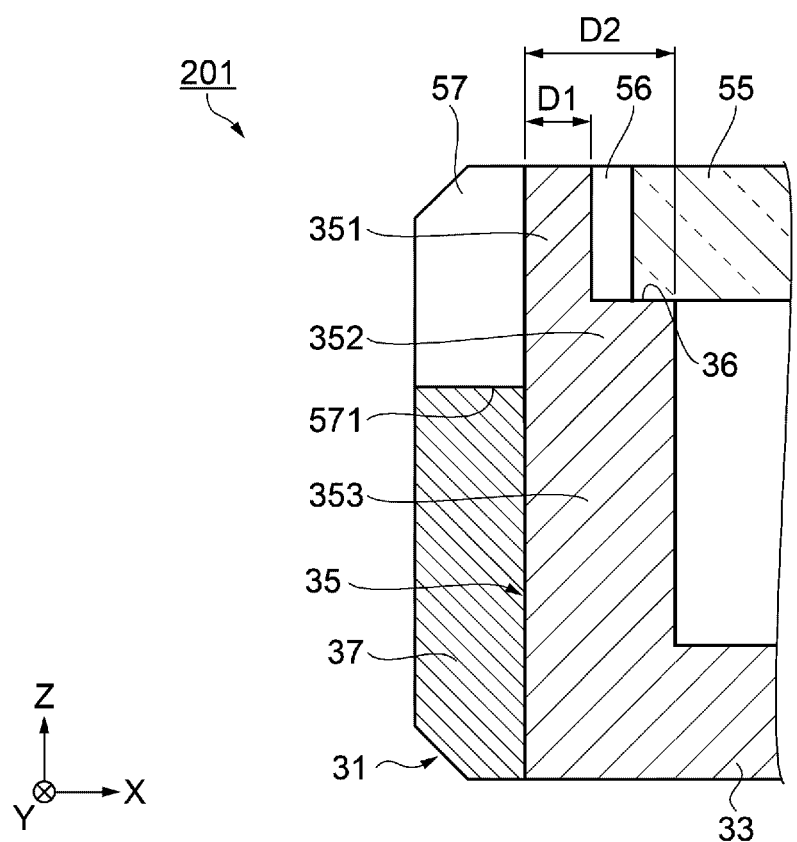
FIG. 6 is a partial enlarged view of the case body, the light transmissive member, and the bezel.
Figure 7:
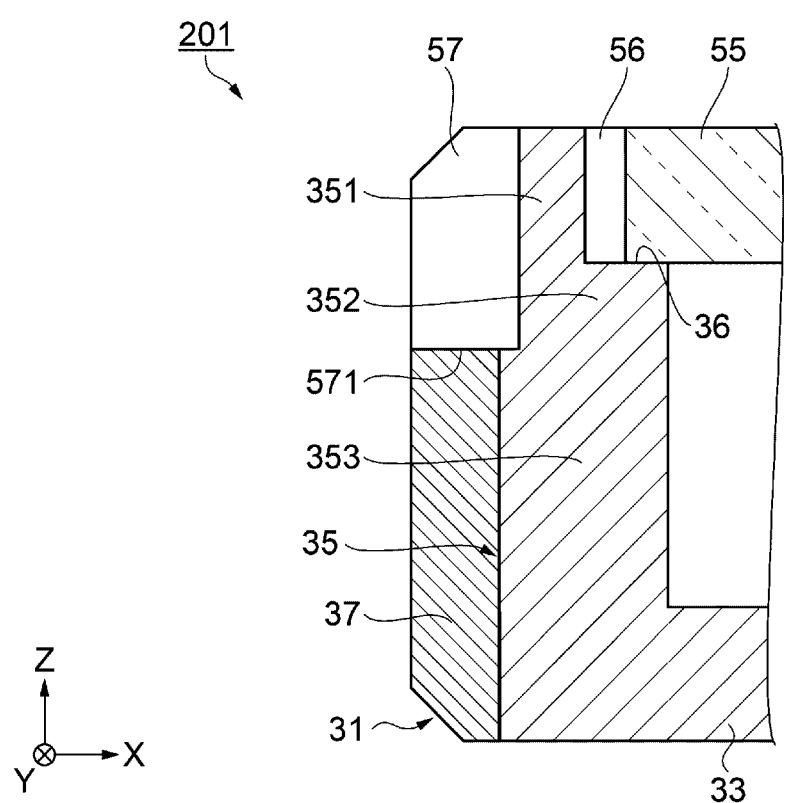
FIG. 7 is another partial enlarged view of the case body, the light transmissive member, and the bezel.
Figure 8:
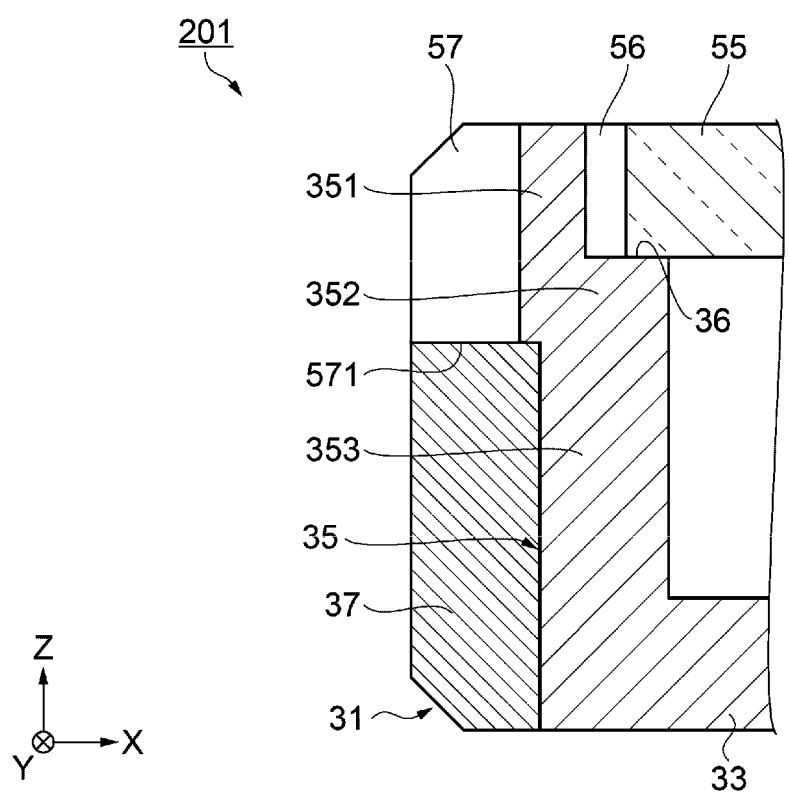
FIG. 8 is another partial enlarged view of the case body, the light transmissive member, and the bezel.
Figure 9:
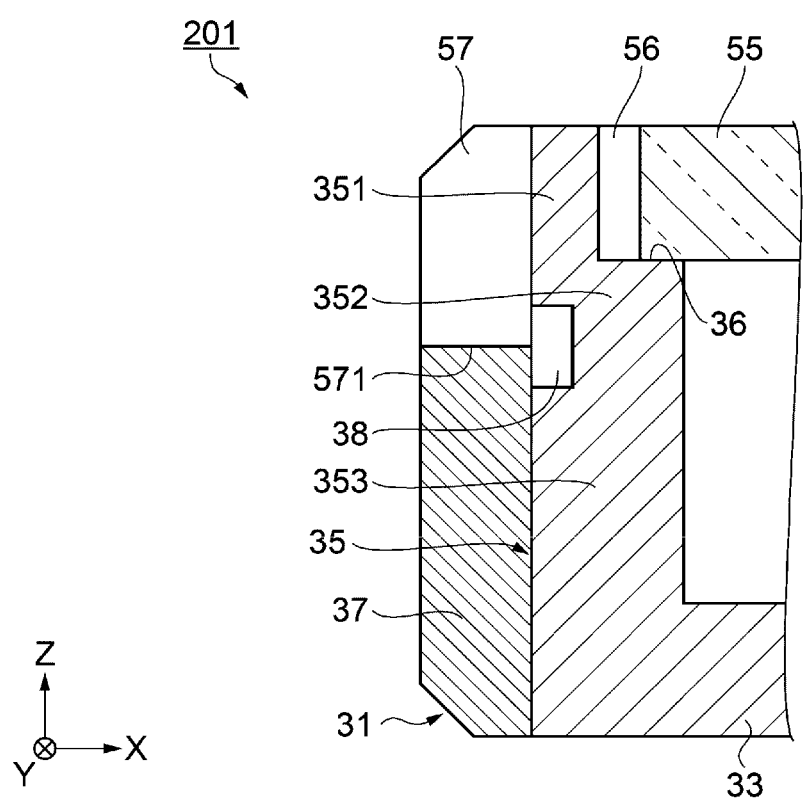
FIG. 9 is another partial enlarged view of the case body, the light transmissive member, and the bezel.

An electronic apparatus according to the present embodiment will be described with reference to FIGS. 5, 6, 7, 8, and 9. The present embodiment will be described with reference also to a wrist apparatus (wearable apparatus), as in the first embodiment. FIG. 5 is a cross-sectional view showing the configuration of a wrist apparatus 201 according to the present embodiment. FIG. 6 is a partial enlarged view of the case body 31, the light transmissive member 55, and the bezel 57. FIG. 7 is another partial enlarged view of the case body 31, the light transmissive member 55, and the bezel 57. FIG. 8 is another partial enlarged view of the case body 31, the light transmissive member 55, and the bezel 57. FIG. 9 is another partial enlarged view of the case body 31, the light transmissive member 55, and the bezel 57. The same constituent portions as those in the first embodiment have the same reference characters, and no redundant description will be made.

The sidewall 35 of the wrist apparatus 201 according to the present embodiment has the first sidewall section 351, the second sidewall section 352, and the third sidewall section 353. The sidewall 35 further has the receiving surface 36, which is a surface located in the case body 31 and perpendicular to the +Z-axis direction. The first sidewall section 351 refers to an upper portion of the sidewall 35 and is disposed between the receiving surface 36 and the opening of the case body 31. The second sidewall section 352 refers to a portion that is part of the sidewall 35 and has the receiving surface 36. The third sidewall section 353 refers to a portion that is part of the sidewall 35 and excludes the first sidewall section 351 and the second sidewall section 352.

The bezel 57 is provided on the side facing the outer circumferences of the first sidewall section 351 and the second sidewall section 352. The light transmissive member (glass plate in the present embodiment) 55, which is a transparent plate, is provided on the receiving surface 36. An exterior cover 37 is provided on the side facing the outer circumference of the third sidewall section 353 and in a position disposed between the end surface 571 of the bezel 57 and the bottom wall 33. The wrist apparatus 201 as the electronic apparatus according to the present embodiment, which includes the exterior cover 37, has improved decorativeness.

The outer circumference of the third sidewall section 353 may be flush with the outer circumference of the second sidewall section 352, as shown in FIG. 6, may be so formed as to be greater than the outer circumference of the second sidewall section 352 and therefore extend outward on the outer side of the case body 31, as shown in FIG. 7, or may be so formed as to be smaller than the outer circumference of the second sidewall section 352 and therefore extend inward on the outer side of the case body 31, as shown in FIG. 8.

The thickness D1 of the first sidewall section 351 is smaller than the thickness D2 of the second sidewall section 352, as in the first embodiment. The light transmissive member 55 can therefore be detached with force having very small magnitude, for example, 40 to 100 N (4 to 10 kgf), as in the first embodiment.

Further, when the bezel 57 is attached to the apparatus body 30, the end surface 517 of the bezel 57, which is the surface located on the side facing the bottom wall 33 of the case body 31, is preferably disposed between the receiving surface 36 and the bottom wall 33, as in the first embodiment. The light transmissive member 55 can therefore be readily detached, as in the first embodiment.

The case body 31 may be made of a resin material or a metal material. In the case where the case body 31 is made of a resin material, the weight of the entire apparatus body 30 can be reduced. In the case where the case body 31 is made of a metal material, the apparatus body 30 is allowed to have a massive exterior appearance despite of the compact case.

The bezel 57 may be made of a resin material or a metal material. In the case where the bezel 57 is made of a resin material, the weight of the entire apparatus body 30 can be reduced. In the case where the bezel 57 is made of a metal material, the apparatus body 30 is allowed to have a massive exterior appearance despite of the compact case.

The exterior cover 37 may be made of a resin material or a metal material. In the case where the exterior cover 37 is made of a resin material, the weight of the apparatus body 30 can be reduced, and the decorativeness of the apparatus body 30 can be improved. In the case where the exterior cover 37 is made of a metal material, the decorativeness of the apparatus body 30 can be further improved as compared with the case where the exterior cover 37 is made of a resin material. In the case where the exterior cover 37 is made of a metal material, the rigidity of the apparatus body 30 can be ensured.

In the case where the exterior cover 37 and the bezel 57 are each made of a metal material, the GPS antenna 28 is preferably located in a position where the GPS antenna 28 does not overlap with the solar battery 80 when the apparatus body 30 is viewed from the side facing the front side thereof (+Z-axis-direction side). In the arrangement described above, the GPS antenna 28 is unlikely to be affected by the exterior cover 37 and the bezel 57, which are each made of a metal material, and the solar battery 80 and can therefore precisely receive radio waves.

The outer circumference of the sidewall 35 may have a groove 38 along the boundary between the second sidewall section 352 and the third sidewall section 353, as shown in FIG. 9. In this case, when the bezel 57 is detached from the apparatus body 30, the flexibility of the pressing force exerted by the first sidewall section 351 in the planar direction can be further improved. That is, detachment of the bezel 57 from the apparatus body 30 allows the first sidewall section 351 to be readily bent outward or the first sidewall section 351 to readily return to the original position before the assembly, so that the pressure exerted by the first sidewall section 351 on the light transmissive member 55 decreases, whereby the light transmissive member 55 held in the case body 31 can be more readily detached.

The exterior cover 37 may be so provided along the entire outer circumference of the third sidewall section 353, or a partly cut out exterior cover 37 may be provided along the outer circumference of the third sidewall section 353. In the case where a partly cut out exterior cover 37 is provided along the outer circumference of the third sidewall section 353, the band sections 10 (see FIGS. 1 and 2) can be provided in correspondence with the positions where the exterior cover 37 is cut out.

Variation 1

Figure 10:
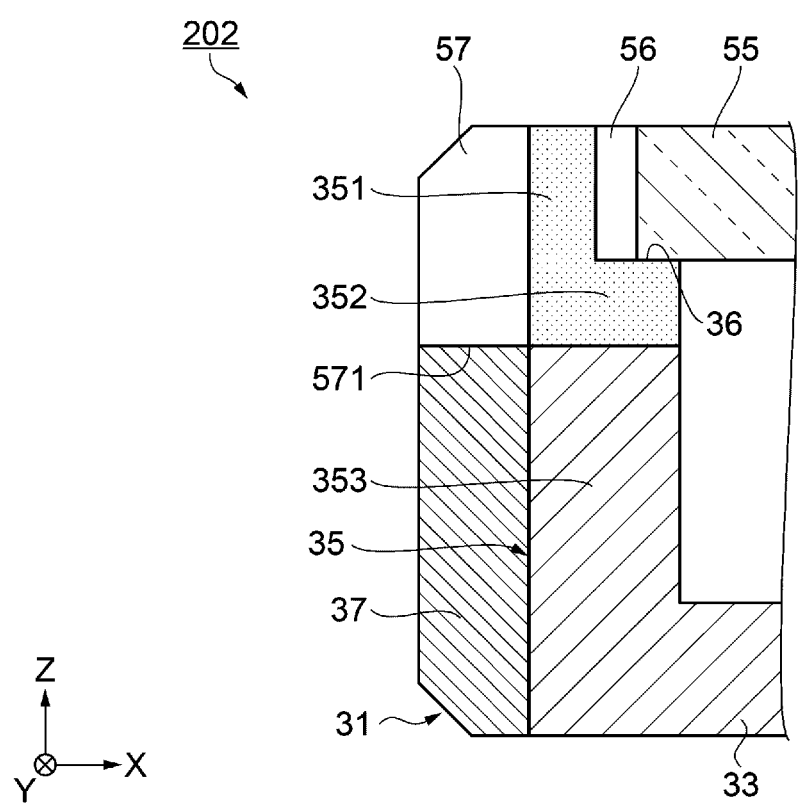
FIG. 10 is a partial enlarged view of the case body, the light transmissive member, and the bezel according to Variation 1.

FIG. 10 is a partial enlarged view of the case body 31, the light transmissive member 55, and the bezel 57 according to the present variation.

The above first and second embodiments have been described with reference to the configuration in which the entire case body 31 is made of the same material, but not necessarily. As an electronic apparatus according to Variation 1, a wrist apparatus 202 will be described below by way of example with reference to FIG. 10. The same constituent portions as those in the first and second embodiments have the same reference characters, and no redundant description will be made.

In the case of the sidewall 35 according to the present variation, the second sidewall section 352 and the third sidewall section 353 are made of different materials and fused into an integrated part. In this case, the elastic modulus E2 of the resin material of which the second sidewall section 352 is made is preferably smaller than the elastic modulus E3 of the resin material of which the third sidewall section 353 is made. That is, the relationship E2<E3 is preferably satisfied. The configuration described above allows the bezel 57 to be detached from the apparatus body 30, the pressure exerted by the bezel 57 on the first sidewall section 351 to be removed, and the first sidewall section 351 to be pressed by the elastic member 56 in the direction toward the exterior of the case body 31 so that the first sidewall section 351 is bent outward or return to the original position before the assembly. That is, when the bezel 57 is detached from the apparatus body 30, the pressure exerted by the first sidewall section 351 on the light transmissive member 55 can be reduced, whereby the light transmissive member 55 held in the case body 31 can be more readily detached.

Variation 2

Figure 11:
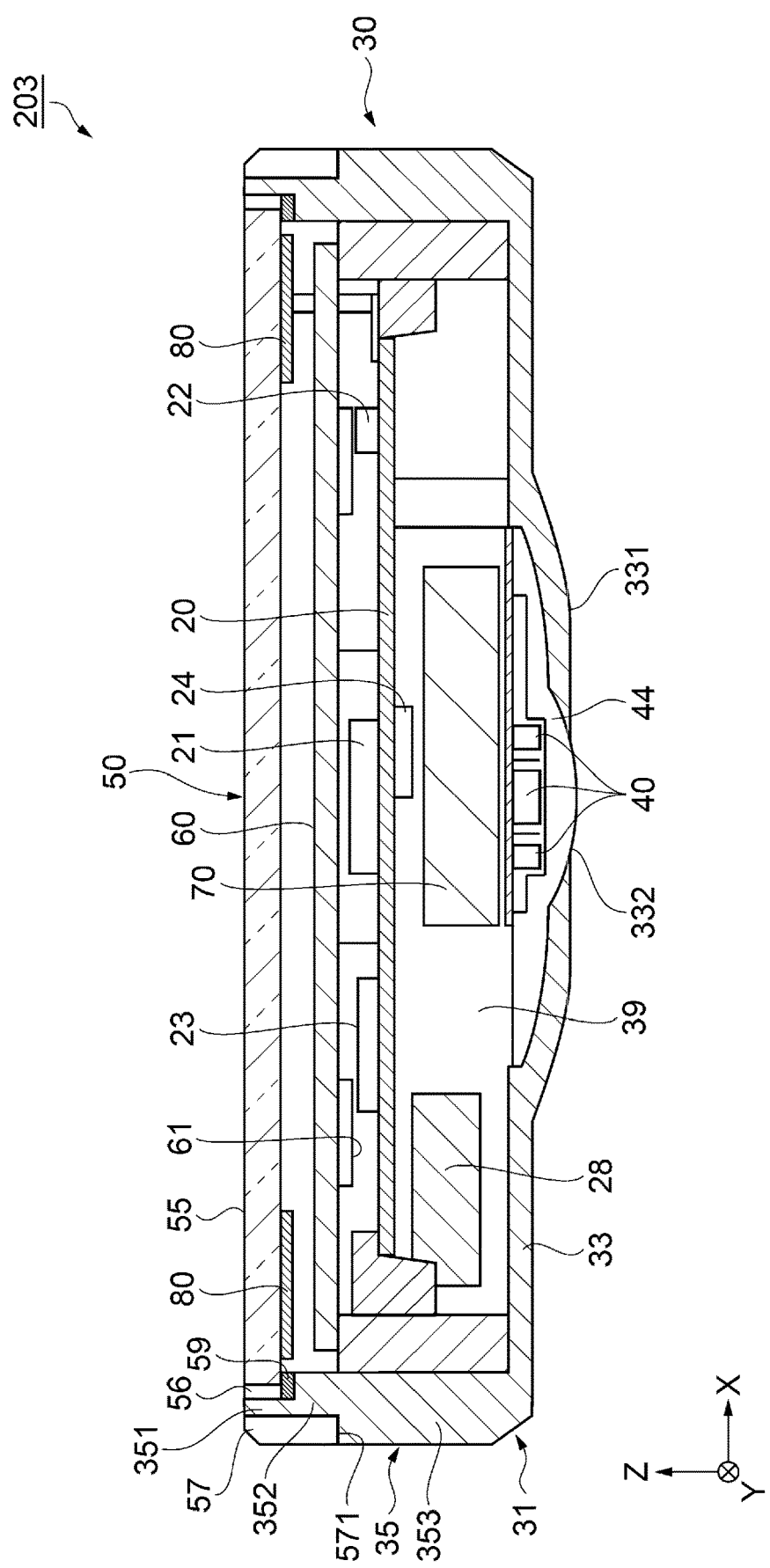
FIG. 11 is a cross-sectional view showing the configuration of a wrist apparatus according to Variation 2.
Figure 12:
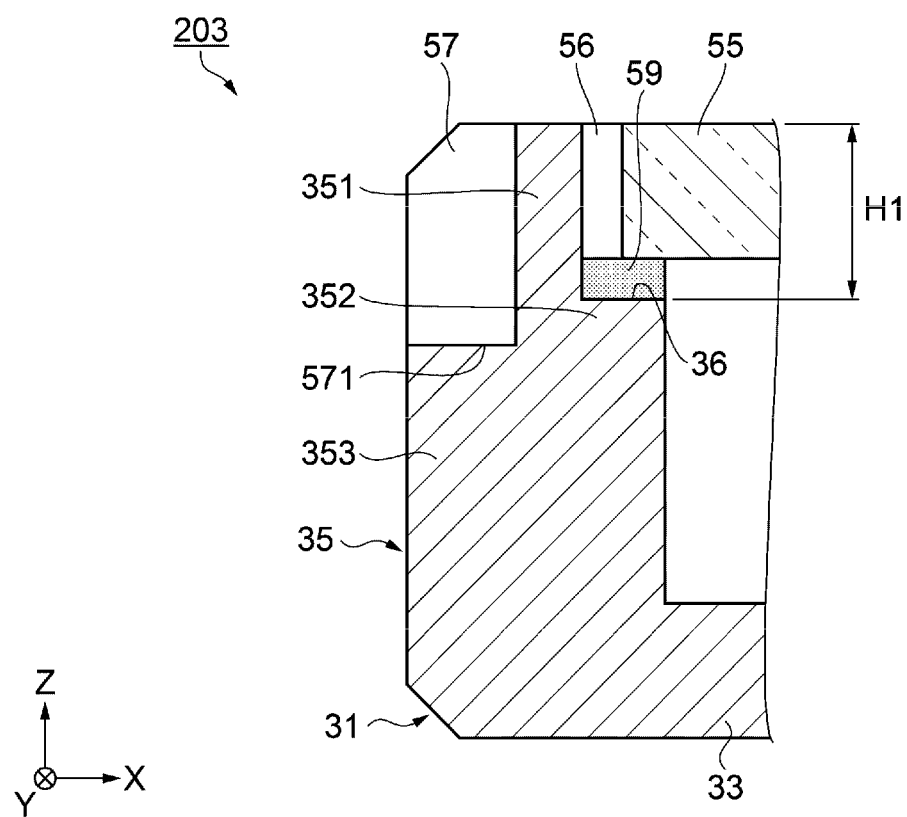
FIG. 12 is a partial enlarged view of the case body, the light transmissive member, the bezel, and an interposed member.
Figure 13:
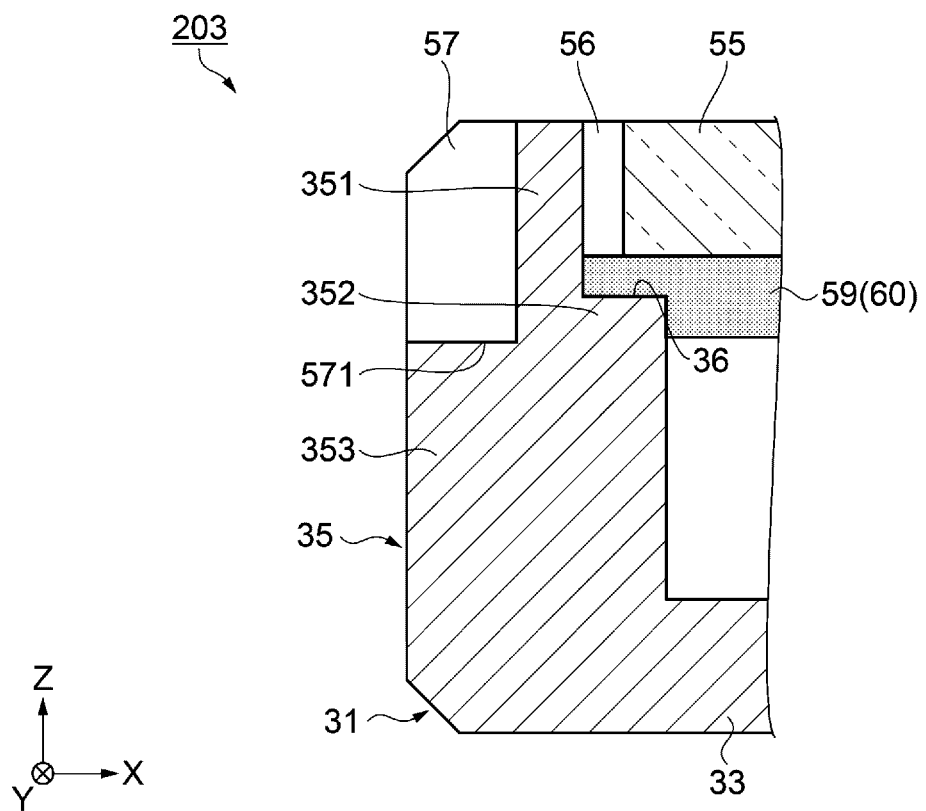
FIG. 13 is another partial enlarged view of the case body, the light transmissive member, the bezel, and the interposed member.

FIG. 11 is a cross-sectional view showing the configuration of a wrist apparatus 203 according to the present variation. FIG. 12 is a partial enlarged view of the case body 31, the light transmissive member 55, the bezel 57, and an interposed member 59. FIG. 13 is another partial enlarged view of the case body 31, the light transmissive member 55, the bezel 57, and the interposed member 59.

The above first and second embodiments and Variation 1 have been described with reference to the configuration in which no interposed member is present between the receiving surface 36 and the light transmissive member 55, and no interposed member is present between the receiving surface 36 and the elastic member 56, but not necessarily. As an electronic apparatus according to Variation 2, a wrist apparatus 203 will be described below by way of example with reference to FIGS. 11, 12, and 13. The same constituent portions as those in the first and second embodiments and Variation 1 have the same reference characters, and no redundant description will be made.

The apparatus body 30 of the wrist apparatus 203 includes the interposed member 59 between the receiving surface 36 and the light transmissive member 55 and between the receiving surface 36 and the elastic member 56, as shown in FIG. 11. Providing the apparatus body 30 with the interposed member 59 allows formation of the first sidewall section 351 with a greater height H1 in the cross-sectional direction (Z-axis direction). That is, the length of the first sidewall section 351 is increased by the amount corresponding to the placed interposed member 59, whereby the flexibility of the setting of the pressing force exerted by the first sidewall section 351 in the planar direction (direction perpendicular to axis Z) can be improved. Detachment of the bezel 57 from the apparatus body 30 therefore allows the first sidewall section 351 to be readily bent outward or the first sidewall section 351 to readily return to the original position before the assembly, so that the pressure exerted by the first sidewall section 351 on the light transmissive member 55 decreases, whereby the light transmissive member 55 held in the case body 31 can be more readily detached.

The interposed member 59 may be made of a metal material or a resin material. Further, for example, the display panel 60 may be configured to also serve as the interposed member 59, as shown in FIG. 13. In the case where the display panel 60 is configured to also serve as the interposed member 59, the display panel 60 can be enlarged. Moreover, the interposed member 59 may have an annular cross-sectional shape in the planar direction (direction perpendicular to Z axis), as does the receiving surface 36, or may have a shape that overlaps with only part of the receiving surface 36, such as a shape having an arbitrary portion cut out.

Variation 3

Figure 14:
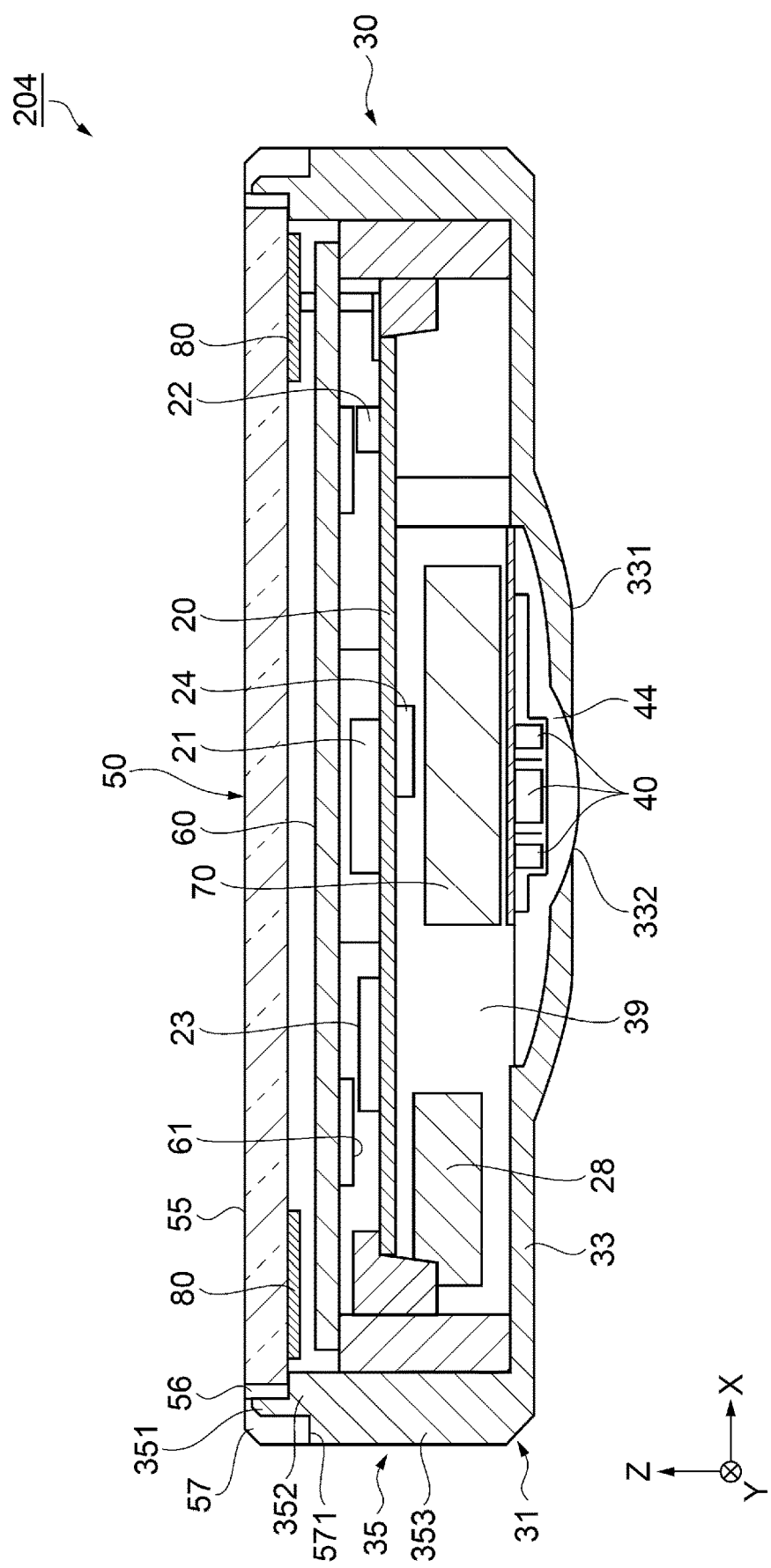
FIG. 14 is a cross-sectional view showing the configuration of a wrist apparatus according to Variation 3.
Figure 15:
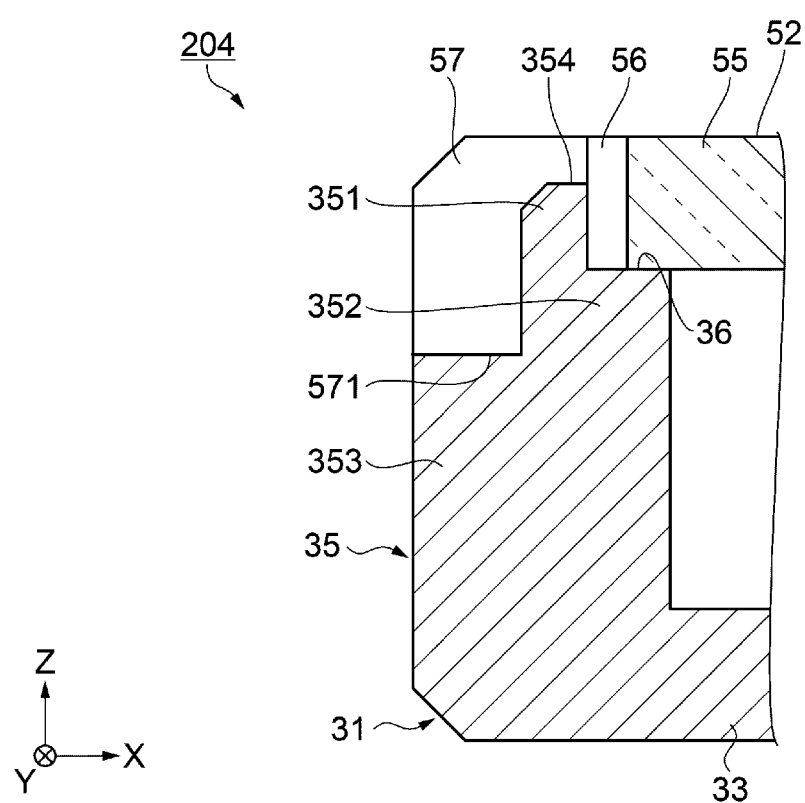
FIG. 15 is a partial enlarged view of the case body, the light transmissive member, and the bezel.

FIG. 14 is a cross-sectional view showing the configuration of a wrist apparatus 204 according to the present variation. FIG. 15 is a partial enlarged view of the case body 31, the light transmissive member 55, and the bezel 57.

The above first and second embodiments and Variations 1 and 2 have been described with reference to the configuration in which an upper end 354 of the first sidewall section 351 is flush with an upper surface 52 of the light transmissive member 55, but not necessarily. As an electronic apparatus according to Variation 3, a wrist apparatus 204 will be described below by way of example with reference to FIGS. 14 and 15. The same constituent portions as those in the first and second embodiments have the same reference characters, and no redundant description will be made.

The upper end 354 of the first sidewall section 351 is disposed between the upper surface 52 of the light transmissive member 55 and the bottom wall 33. As a result, the bezel 57 can be provided around the outer circumferences of the first sidewall section 351 and the second sidewall section 352 and further on the upper end 354 of the first sidewall section 351. That is, the bezel 57 can be widened when the apparatus body 30 is viewed from the side facing the front side thereof (+Z-axis-direction side). Widening the bezel 57 allows further improvement in the decorativeness of the apparatus body 30. For example, the color tone of the bezel 57 is allowed to differ from the color tone of the other portions, and letters can be printed on the bezel 57.

Variation 4

Figure 16:
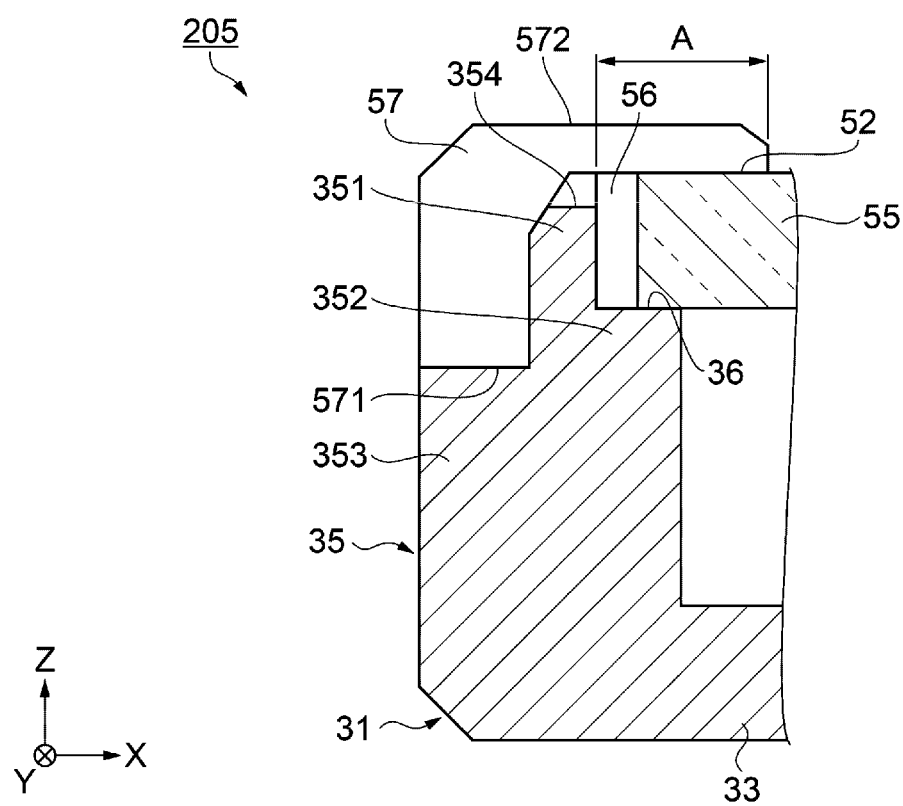
FIG. 16 is a partial enlarged view of the case body, the light transmissive member, and the bezel of the wrist apparatus according to Variation 4.

FIG. 16 is a partial enlarged view of the case body 31, the light transmissive member 55, and the bezel 57 of a wrist apparatus 205 according to the present variation.

In Variation 3 described above, the upper end 354 of the first sidewall section 351 is disposed between the upper surface 52 of the light transmissive member 55 and the bottom wall 33, and the bezel 57 is located on the upper end 354 with the inner front end of the bezel 57 being in contact with the elastic member 56. In the present variation, however, the bezel 57 is located on the upper surface 52 of the light transmissive member 55, as shown in FIG. 16. In detail, the bezel 57 extends inward by a distance A along the entire circumference with the bezel 57 overlapping with the upper surface 52 of the light transmissive member 55 including the elastic member 56. The area over the distance A therefore overlaps with the upper surface 52 of the light transmissive member 55 including the elastic member 56 when the apparatus body 30 is viewed from the side facing the front side thereof (+Z-axis-direction side).

In a case configuration in which the sidewall and the bottom wall are separate from each other, as in related art, the upper surface of the light transmissive member cannot be covered with the bezel because the bezel is fixed to the case and then the light transmissive member is assembled. In contrast, the configuration according to the present variation, which employs the one-piece structure in which the sidewall 35 and the bottom wall 33 are integrated with each other, allows the bezel 57 to be assembled after the light transmissive member 55 is placed in the case (case body 31), whereby the bezel 57 can be placed on the upper surface 52 of the light transmissive member 55, and a wide bezel 57 can therefore be achieved. The wide bezel 57 allows the outer circumferential end surface of the light transmissive member 55 to be hidden, the upper surface 572 of the wide bezel 57 to be decorated, as in Variation 3, and other preferable features to be provided, whereby the flexibility of the exterior appearance design of the wrist apparatus 205 can be improved.

Variation 5

The above first and second embodiments and Variations 1 to 4 have been described with reference to the wrist apparatuses 200 to 205 as the electronic apparatus, but not necessarily. For example, the case body, the light transmissive member, the bezel, the exterior cover, the interposed member, and other components described above can be used in an analog-display timepiece and wall clock using an hour hand, a minute hand, and other components, a mobile phone, a smartphone, a personal computer, a tablet terminal, and other electronic apparatuses.

The entire disclosure of Japanese Patent Application No. 2018-003158, filed Jan. 12, 2018 is expressly incorporated by reference herein.

What is claimed is:

1. An electronic apparatus comprising:
    a case including a bottom wall and a sidewall integrated with each other, having an opening, and having a receiving surface provided as part of the sidewall and along a circumferential edge of the opening;
    a light transmissive member that covers the opening and is placed on the receiving surface; and
    a bezel provided in a position outside the sidewall that forms the receiving surface and so attached to the case as to be pressed toward the sidewall,
    wherein the sidewall includes:
    an upper portion that has the receiving surface,
    a lower portion between the upper portion and the bottom wall, the lower portion surrounding the bottom wall, and
    the upper portion and the lower portion are made of different materials.

2. The electronic apparatus according to claim 1, wherein an end surface of the bezel that is a surface facing the bottom wall is disposed between the receiving surface and the bottom wall.

3. The electronic apparatus according to claim 1, wherein an elastic member is placed between an inner surface of the sidewall and an outer circumferential end surface of the light transmissive member.

4. The electronic apparatus according to claim 1, wherein an interposed member is placed between the receiving surface and the light transmissive member.

5. The electronic apparatus according to claim 1, further comprising an exterior cover disposed between the bottom wall and an end surface of the bezel that is a surface facing the bottom wall, and outside the sidewall.

6. The electronic apparatus according to claim 5, wherein a groove is provided on an outer side of the sidewall.

7. An electronic apparatus comprising:
    a case including a bottom wall and a sidewall integrated with each other, having an opening, and having a receiving surface provided as part of the sidewall and along a circumferential edge of the opening;
    a light transmissive member that covers the opening and is placed on the receiving surface; and
    a bezel that surrounds the light transmissive member and the sidewall,
    wherein the sidewall has
    a first sidewall section that is an upper portion of the sidewall and has the receiving surface that receives the light transmissive member,
    a second sidewall section that is a portion disposed between the first sidewall section and the bottom wall and receives the light transmissive member, and
    a third sidewall section between the second sidewall section and the bottom wall, the third sidewall section surrounding the bottom wall,
    the second sidewall section and the third sidewall section are made of different materials, and
    the bezel is provided in a position outside the sidewall that forms the receiving surface and so attached to the case as to be pressed toward the sidewall.

* * * * *